United States Patent [19]
Roth

[11] Patent Number: 5,327,324
[45] Date of Patent: Jul. 5, 1994

[54] SPRING CLIP FOR A HEAT SINK APPARATUS

[75] Inventor: Gregory A. Roth, Dearborn, Mich.

[73] Assignee: Ford Motor Company, Dearborn, Mich.

[21] Appl. No.: 147,501

[22] Filed: Nov. 5, 1993

[51] Int. Cl.$^5$ .............................................. H05K 7/20
[52] U.S. Cl. ................................... 361/707; 174/16.3; 257/726; 257/727; 267/160; 361/710
[58] Field of Search .................. 165/80.3, 185; 174/16.3; 257/718, 719, 726, 727; 267/150, 160; 361/704, 707-719, 722, 809

[56] References Cited

U.S. PATENT DOCUMENTS

| | | | |
|---|---|---|---|
| 4,259,685 | 3/1981 | Romano | 357/81 |
| 4,537,246 | 8/1985 | Lloyd | 165/80 B |
| 4,674,005 | 6/1987 | Lacz | 361/388 |
| 4,707,726 | 11/1987 | Tinder | 357/81 |
| 4,709,302 | 11/1987 | Jordan et al. | 361/388 |
| 4,710,852 | 12/1987 | Keen | 361/386 |
| 4,922,601 | 5/1990 | Mikolajczak | 29/450 |
| 4,933,746 | 6/1990 | King | 357/81 |
| 5,031,028 | 7/1991 | Galich et al. | 357/81 |
| 5,170,325 | 12/1992 | Bentz et al. | 361/388 |
| 5,179,506 | 1/1993 | Corbett et al. | 361/417 |
| 5,208,731 | 5/1993 | Blomquist | 361/386 |
| 5,225,965 | 7/1993 | Bailey et al. | 361/386 |
| 5,274,193 | 12/1993 | Bailey et al. | 361/704 |

FOREIGN PATENT DOCUMENTS 1129010 2/1961 Fed. Rep. of Germany .

*Primary Examiner*—Gregory D. Thompson
*Attorney, Agent, or Firm*—Raymond L. Coppiellie; Roger L. May

[57] ABSTRACT

A spring clip for urging an electrical component onto a heat sink housing within an electronics component module is described. The spring clip comprises an elongated planar body, retention device for securing the body of the spring clip to the heat sink housing, the retention device depending downward from the body. The spring clip also includes urging device for contacting and urging the electrical component into a heat conducting relationship with the heat sink housing. The urging device includes a first elongate member depending downward from the body to a u-shaped junction. A second elongate member, extending upward from the u-shaped member and terminating at a contact surface, maintains the electrical component in a heat conducting relationship with the heat sink housing.

19 Claims, 2 Drawing Sheets

SPRING CLIP FOR A HEAT SINK APPARATUS

FIELD OF THE INVENTION

This invention relates to the urging of electrical components onto a heat sink. More particularly, the present invention relates to a spring clip for urging electrical components onto a heat sink housing of an electronics module.

BACKGROUND OF THE INVENTION

Typically, the assembly of an electronics module involves mounting various electrical components to a printed circuit board. Electrical components, such as transistors, generate significant amounts of heat requiring special provisions to dissipate the generated heat. The electrical component should be in thermally conductive contact with a heat sink to obtain maximum heat transfer from the electrical component to the heat sink. This conductive heat transfer is directly proportional to the contact pressure between the component and the heat sink.

Various spring devices have been designed for urging an electrical component into contact with a heat sink. U.S. Pat. Nos. 5,225,965 and 5,170,324 illustrate a spring clip for urging an electrical component into a heat conductive relationship with a vertical heat sink. These spring clips exhibit a common deficiency: they are retained in position by clamping over the top of the vertical heat sink. This configuration prevents the use of a heat sink as an outside wall of a sealed electronics module. Furthermore, due to the method of retention, the effective spring force applied to the electrical component is dependent upon the tolerances of the retaining clamp.

For a compact electronics module it would be desirable to provide a spring clip for urging an electrical component against a heat sink which also serves as an exterior housing for a sealed electronics module. Still further, it would be desirable to provide a spring clip that is capable of exerting a force on the electrical component independent of precision tolerancing, thereby eliminating high costs of precision tolerancing.

SUMMARY OF THE INVENTION

The present invention advances beyond the systems described above by providing a spring clip for urging an electrical component onto a heat sink housing. The spring clip comprises an elongated planar body having a longitudinal axis extending from a right end to a left end, an intermediate portion therebetween, and an inner edge and an outer edge parallel to the longitudinal axis thereof. The spring clip also includes retention means for securing the body of the spring clip to the heat sink housing. The retention means depends downward from each of the right and left ends of the body. The spring clip also includes urging means for contacting and urging the electrical component into a heat conducting relationship with the heat sink housing. The urging means includes a first elongate member depending downward from the inner edge of the body to a first end, a u-shaped junction extending from the first end to a second elongate member extending upward from the u-shaped member toward the outer side of the body, terminating at a contact surface for maintaining the electrical component in a heat conducting relationship with the heat sink housing.

It is an advantage of the present invention to provide a spring clip for urging an electrical component into a heat conductive relationship with a heat sink, wherein the heat sink is an exterior wall of a heat sink housing of a sealed electronics module.

Other objects, features and advantages of the present invention will become apparent to those skilled in the art from the drawings, detailed description and claims which follow.

DESCRIPTION OF THE PREFERRED EMBODIMENT

Figure 1:
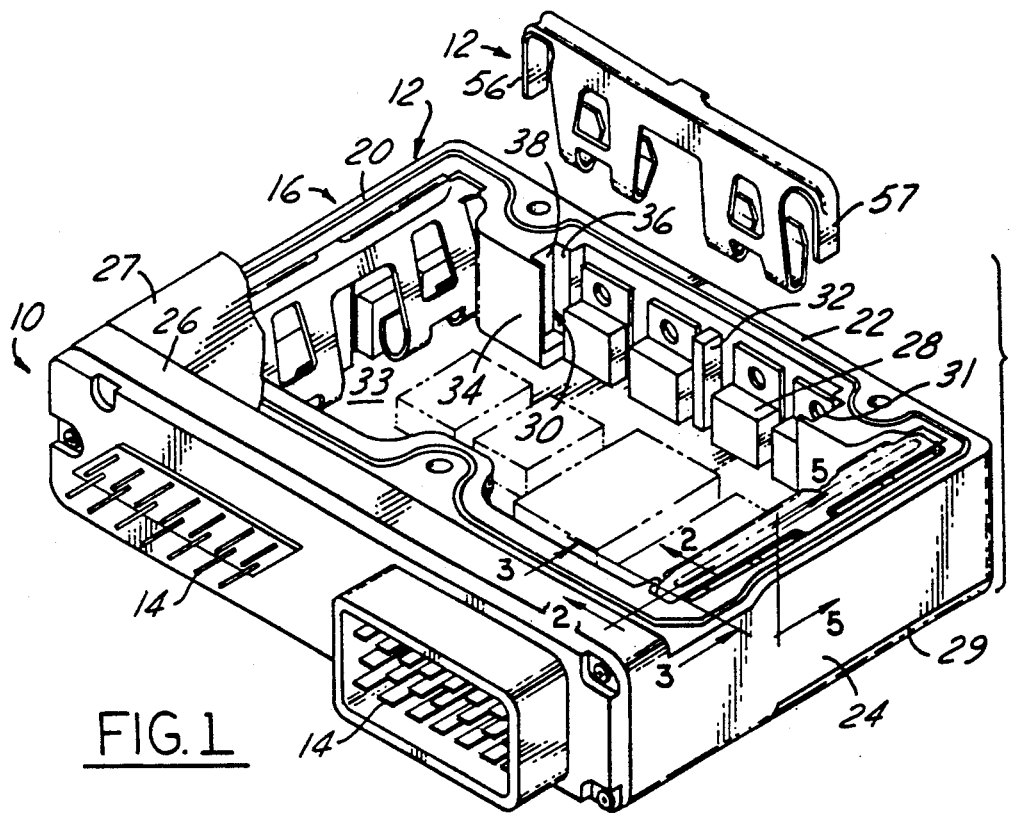
FIG. 1 is a perspective view of an electronics module including a heat sink housing and spring clip according to the present invention.

Referring now to FIG. 1, an electronics module 10 is shown having a spring clip 12 installed in a heat sink housing 16 of the electronics module 10. Heat sink housing 16 has four exterior walls, 20, 22, 24 and 26, a top plate 27 and a bottom plate 29 which combine to create the sealed module 10 housing a plurality of electrical components 28 connected to a circuit board 33, which in turn is connected to an input/output port 14. The circuit board 33 is disposed generally parallel to the bottom plate 29 and adjacent to the exterior walls 20, 22, 24 and 26 of the housing 16. The heat sink housing 16 is constructed of a heat conductive material such as cast aluminum. The heat sink housing 16 includes pockets 30 and 31 located at opposite ends of the wall 22, and a vertical rib 32 substantially midway between the pockets 30 and 31 for receiving and retaining spring clip 12.

Figure 2:
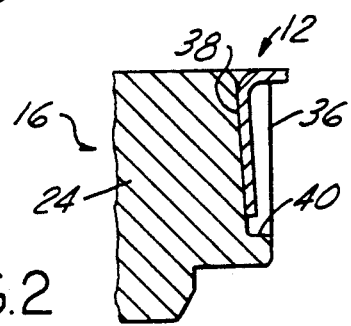
FIG. 2 is a sectional view of a spring clip retention means taken along line 2—2 of FIG. 1 according to the present invention.
Figure 3:
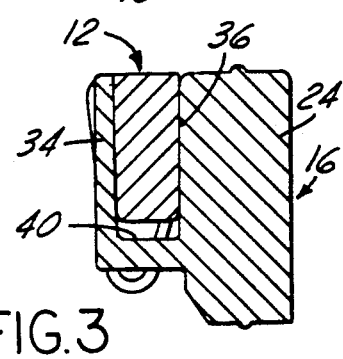
FIG. 3 is a sectional view of a spring clip taken along line 3—3 of FIG. 1 according to the present invention.

As can be seen in FIGS. 2 and 3, the pockets 30, 31 include an inner shoulder 34, an outer shoulder 36, and an intermediate wall 38 between the shoulders. The entrance to the pocket may be chamfered, and the intermediate wall 38 may have a 2–5 degree draft toward the opposite pocket from the top to its bottom surface 40. The depth of the pockets 30 and 31 is sufficient to prevent the spring clip 12 from bottoming in the pockets 30 and 31, thereby allowing the rib 32 to control the insertion depth. The pockets 30 and 31 require no finish machining and can be left in an as-cast state.

Figure 4:
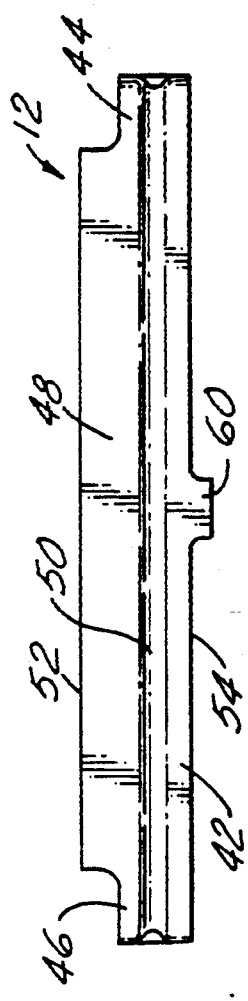
FIG. 4 is a top plan view of a spring clip according to the present invention.

As can be seen from FIG. 4, the spring clip 12 includes an elongated planar body 42 having a longitudinal axis, a right end 44 and left end 46, an intermediate portion 48, and a reinforcing groove 50 extending from the right end 44 to the left end 46, parallel to the longitudinal axis of the body. The depth of groove 50 is substantially equal to the metal thickness of the spring clip 12. The elongated planar body 42 further includes an inner edge 52 adjacent to the interior of the module 10, and an outer edge 54 adjacent to an exterior wall of the housing 16. The inner edge 52 and the outer edge 54 are aligned parallel to the longitudinal axis of the elongated planar body 42. A tab 60 is disposed on the outer edge 54 of the elongated planar body 42.

The spring clip 12 of the present invention is typically formed from a metal blank in a stamping operation. However, the present invention contemplates that a spring clip may be formed from a variety of resilient materials including plastics through an injection molding process.

Figure 5:
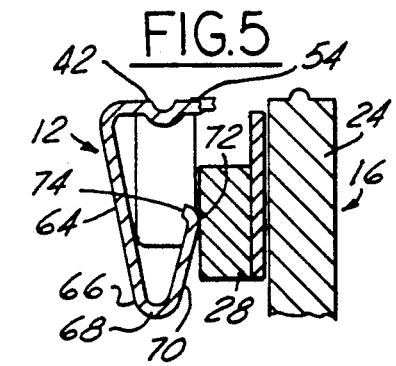
FIG. 5 is sectional view taken along line 5—5 of FIG. 1 showing a spring clip urging an electrical component into thermally conductive contact with the heat sink housing in accordance with the present invention.

Referring now to FIG. 5, the spring clip 12 incorporates a double cantilever design to reduce the variation in effective spring force for urging the electrical component 28 onto heat sink 16. The first cantilever of the double cantilever design consists of a first elongated member 64 depending downward from the inner edge 52 of the elongated planar body 42. The first end 66 of the first elongated member 64 terminates at a u-shaped junction 68. The second cantilever consists of a second elongated member 70 which extends upward from the u-shaped junction 68 toward the outside edge 54 of the elongated planar body 42 and terminates at a contact surface 72. The contact surface 72 may be located substantially midway between the u-shaped junction 68 and the outside edge 54. Preferably, a terminal portion 74 of the second elongated member 70 is rolled back toward the first elongated member, away from said electronic component 28 to provide a smooth contact surface 72.

Figure 6:
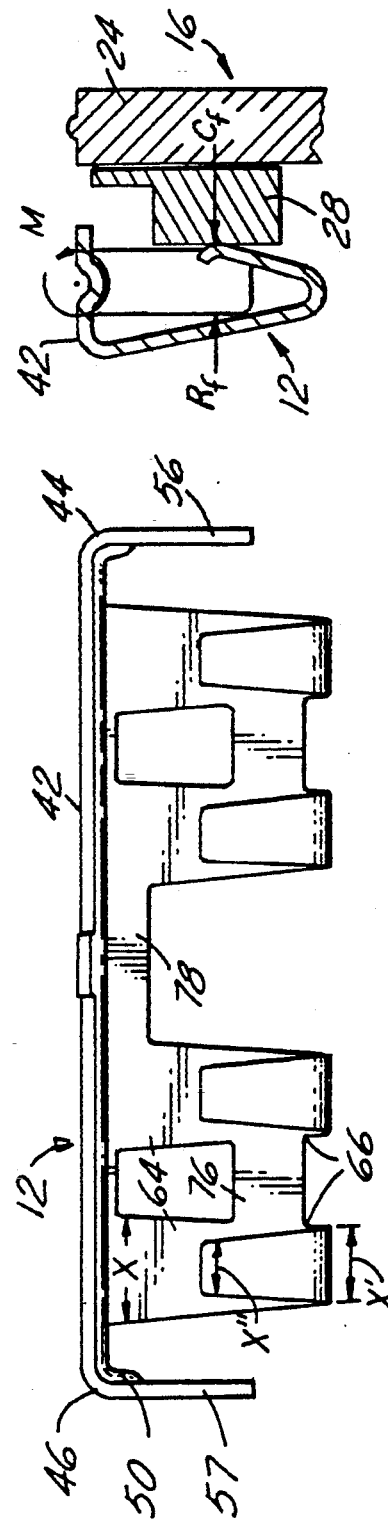
FIG. 6 is front elevational view of a spring clip according to the present invention.

As illustrated in FIG. 6, the preferred embodiment includes four first elongated members 64, each having a width greater near the elongated body 42 (x) than near the u-shaped junction 68 (x'). The preferred embodiment also includes four u-shaped junction 68 and four second elongate members 70, each having a width greater neart the u-shaped junction 68 than at the contact surface 72. Designs having multiple first elongated members 64 may also include an equalizer bar 76 interconnecting the first ends 66 of two adjacent first elongated members 64. As an alternative to using an equalizer bar 76, a bridge 78 may interconnect two first elongated members 64 along the inner edge 52 of the elongated planar body 42. It should be obvious to those skilled in the art that combining an equalizer bar 76 and a bridge 78 will obtain even greater increases of torsional rigidity of the spring clip 12.

As is also shown in FIG. 6, retainers 56 and 57 depend downward substantially vertically from ends 44 and 46 of the elongate planar body 42. The length of the retainers 56 and 57 is slightly shorter than the depth of the pockets 30 and 31 as is illustrated in FIGS. 2 and 3. Further, the retainers 56 and 57 cant toward each other approximately 2-5 degrees, such that the included angle is slightly less than 90 degrees, and the reinforcement groove 50 extends downward into retainers 56 and 57.

Figure 7:
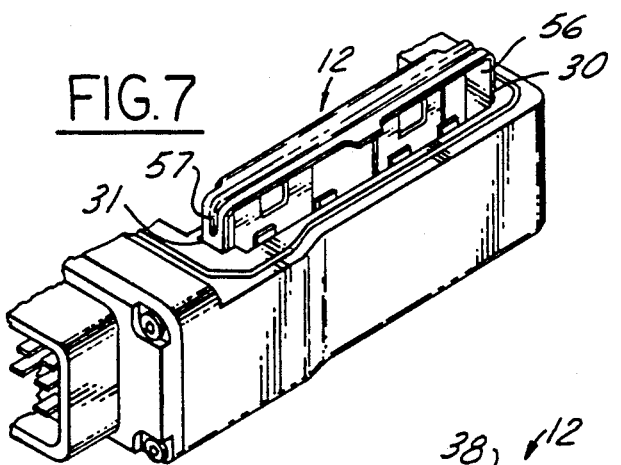
FIG. 7 is a perspective view of a partially installed spring clip according to the present invention.

Referring now to FIG. 7, spring clip 12 is installed in the heat sink housing 16 by manually or robotically sliding retainers 56 and 57 into pockets 30 and 31, respectively. Designing intermediate walls 38 with draft angles matching the angle of retainers 56 and 57 allows the spring clip 12 to be inserted into a first position. At a subsequent assembly station, the spring clip 12 is forcibly inserted in a final installed position urging the electrical component 28 into wall 24 of the heat sink 16. The final installation depth of the spring clip is also limited by the engagement of tab 60 with rib 32 on exterior wall 22.

Figure 8:
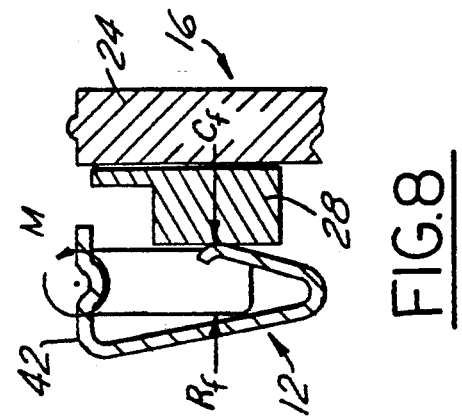
FIG. 8 is a side elevational view of a spring clip according to the present invention.

Two principal forces retain the spring clip 12 in the heat sink housing 16. First, compressive forces generated by forcing retainers 56 and 57 into pockets 30 and 31 act parallel to the longitudinal axis of the elongated planar body 42. As can be seen in FIG. 8, a second retention enhancing force results from the equal and opposite reaction to the force applied to the electrical component 28. This component force $C_f$ can be resolved into a moment M about the elongated planar body 42, which in turn is reacted by reaction force $R_f$ at the interface between the retainers 56 and 57 and the inner shoulder 34 and outer shoulder 36 of the pockets 30 and 31. It is significant that the component force acts substantially perpendicular to the compressive retention force which are parallel to the longitudinal axis of the elongated planar body 42. Since the position of the spring clip primarily varies along this longitudinal axis, the effective spring force is substantially decoupled from variations in the installed position of the spring clip 12 within the heat sink housing 16.

To provide consistent effective spring force to multiple electrical components 28, the spring clip 12 must be designed with high torsional rigidity to reduce deflection due to the moment M. Excessive torsional deflection changes the critical positioning of the individual contact surface 72 relative to the electrical component 28. The present invention minimizes this effect in several ways.

For example, placing the reinforcement groove 50 in the elongated planar body 42 and extending it downward into retainers 56 and 57 increases the torsional stiffness of the elongate body 42 and its intersection with of the retainers 56 and 57. Additionally, tapering the width of the first elongated member 64 provides a wide portion adjacent to the inner edge 52 to increase the torsional rigidity of the spring clip 12. The equalizer bar 76 and the bridge 78 also increases the torsional rigidity of the spring clip 12. The tab 60 on the outer edge 54 of the elongated planar body 42 also prevents rotation of the planar body 42 about its longitudinal axis by engaging the rib 32 on the exterior wall 22.

Various other modifications and permutations of the present invention, no doubt, will occur to those skilled in the art. Therefore, it is the following claims, including all equivalents, which define the scope of the present invention.

We claim:

1. A spring clip for urging an electrical component onto a heat sink housing, said spring clip comprising:

an elongated planar body having a longitudinal axis extending from a right end to a left end, an intermediate portion therebetween, and an inner edge and an outer edge parallel to said longitudinal axis;

retention means for securing the body to said, heat sink housing, said retention means depending downward from each of said right and left ends of said body;

urging means for contacting and urging the electrical component into a heat conducting relationship with the heat sink housing, said urging means including a first elongated member depending downward from said inner edge of said body to a first end, a u-shaped junction extending from said first end to a second elongated member extending upward from said u-shaped junction toward said outer edge of said body, terminating at a contact surface.

2. A spring clip according to claim 1 wherein said first elongated member of said urging means tapers from said inner edge to said first end and said second member tapers from said u-shaped junction to said contact surface.

3. A spring clip according to claim 1, wherein said contact surface of said urging means further comprises a terminal portion turned away from the electrical component.

4. A spring clip according to claim 1, wherein said urging means comprises:
  at least two first elongated members depending from said inner edge of said body to a first end, each of said at least two first members including a u-shaped junction extending from said first end to a second elongated member extending upward from said u-shaped junction toward said outer edge of said body and terminating at a contact surface; and
  an equalizer member interconnecting said at least two first elongated members, said equalizer member being adapted to increase the torsional rigidity of said elongated planar body to reduce the variability of contact pressure among multiple electrical components.

5. A spring clip according to claim 4, wherein said urging means comprises a bridge depending from said outer edge and disposed between said at least two first elongated members, said bridge being adapted to increase the torsional rigidity of said elongated planar body to reduce the variability of contact pressure among multiple electrical components.

6. An electronic module having an electrical component, said module comprising:
  a heat sink housing including:
    a wall having a first and a second end;
    a first pocket disposed at said first end of said wall;
    a second pocket disposed at said second end of said wall;
    a vertical rib disposed on said wall substantially midway between said first end and said second end;
  a spring clip including an elongated planar body having a longitudinal axis extending from a right end to a left end, an intermediate portion therebetween, and an inner edge and an outer edge parallel to said longitudinal axis, said clip comprising;
    retention means for securing said clip to said heat sink housing, said retention means extending downward from each of said ends of said body;
    a tab disposed on said outer edge of said intermediate portion of said planar body substantially midway between said right and left ends, said tab being operative to contact said rib to limit the installation depth of said body into said heat sink housing; and
    urging means for contacting and urging said electrical component into a heat conducting relationship with said heat sink housing, said urging means includes a first elongated member depending downward from said inner edge of said body to a first end, a u-shaped junction extending from said first end to a second elongate member extending upward from said u-shaped junction toward said outer edge of said body, terminating at a contact surface.

7. An electronic module according to claim 6, wherein said retention means is operative to compressively engage said first and second pockets upon insertion therein and operative to secure said clip in said heat sink housing.

8. An electronic module according to claim 6, wherein said tab is further operative to prevent rotation of said planar body about its longitudinal axis.

9. An electronic module according to claim 6, wherein said planar body further comprises a reinforcement groove traversing from said right end to said left end substantially parallel to said longitudinal axis of said planar body, said reinforcement groove being adapted to increase the torsional rigidity of said elongated planar body to reduce the variability of contact pressure among multiple electrical components.

10. A electronic module according to claim 6, wherein said first elongated member of said urging means tapers from said inner edge to said first end and said second member tapers from said u-shaped junction to said contact surface.

11. An electronic module according to claim 6, wherein said contact surface of said urging means further comprises a terminal portion turned away from said electrical component.

12. An electronic module according to claim 6, wherein said spring clip further comprising:
  at least two first elongated members depending from said inner edge of said body to a first end, each of said at least two first members including a u-shaped junction extending from said first end to a second elongated member extending upward from said u-shaped junction toward said outer edge of said body, terminating at a contact surface; and
  an equalizer member interconnecting at least two of said first members, said equalizer member being adapted to increase the torsional rigidity of said elongated planar body to reduce the variability of contact pressure among multiple electrical components.

13. An electronic module according to claim 12, wherein said urging means comprises a bridge depending from said outer edge, spanning between said at least two first elongated members, said bridge adapted to increase the torsional rigidity of said elongated planar body to reduce the variability of contact pressure among multiple electrical components.

14. An electronic module according to claim 6, wherein said urging means is operative to generate a predetermined contact pressure between said electronic component and said heat sink housing thereby establishing a predetermined heat conducting relationship therebetween; and
  said retention means is operative to generate a retention force between said retention means and said first and second pockets, said retention force being parallel to said longitudinal axis and perpendicular to said contact pressure.

15. An electronics component module for an automotive vehicle, said module comprising:
  a heat sink housing including an exterior wall on said heat sink housing on which an electronic device is maintained in a thermally conductive relationship, said wall further includes a pair of vertically extending pockets offset on an interior side of said wall and oppositely disposed, said wall further comprises a vertical rib disposed on said interior side of said wall substantially midway between said pockets;

a top cover directly and sealingly securable to said heat sink housing;

a bottom cover directly and sealingly securable directly to said heat sink housing, thereby forming a sealed electronic module;

a spring clip including an elongated planar body having a longitudinal axis extending from a right end to a left end, an intermediate portion therebetween, and an inner edge and an outer edge parallel to said longitudinal axis, said spring clip comprising:

retainers extending downward from each of said ends of said body, said retainers adapted to compressively engage said first and second pockets, operatively securing said planar body in said heat sink housing;

a first elongated member extending downward from said inner edge of said body to a first end, a u-shaped junction extending from said first end to a second elongated extending upward from said u-shaped junction toward said outer edge of said body, terminating at a contact surface, said contact surface adapted to maintain said electrical component in a heat conducting relationship with said heat sink housing; and a tab disposed on said outer edge of said intermediate portion of said planar body substantially midway between said right and left ends, said tab being operative to engage said rib to limit the installation depth of said body into said heat sink housing.

16. An electronic component module according to claim 15, wherein said pockets are chamfered to enhance insertion of said retainers.

17. An electronic component module according to claim 15, wherein said retainers are of a predetermined length so as to permit partial installation into said pockets, sufficient to prevent said retainers from disengaging from said pockets during transport on a conveyor prior to final installation.

18. An electronic component module according to claim 15, wherein said retainers comprises a tab disposed on each of said ends of said elongated planar body, splayed inward to form an angle nominally less than 90 degrees with said elongated body.

19. An electronic component module according to claim 18, wherein said pockets further comprise:

an inner shoulder disposed nearest the interior of said module;

an outer shoulder disposed adjacent to said wall, in combination with said inner wall, operative to prevent the rotation of said retainer, thereby preventing the rotation of said elongated body about said longitudinal axis of said body; and an intermediate wall disposed between said inner shoulder and said outer shoulder, having a slope substantially parallel to said tab, said intermediate wall being operative to engage said tab in a compressive relationship confining said tab with respect to the longitudinal axis of said elongated body.

* * * * *